United States Patent [19]
Yang

[11] Patent Number: 5,451,534
[45] Date of Patent: Sep. 19, 1995

[54] METHOD OF MAKING SINGLE LAYER THIN FILM TRANSISTOR STATIC RANDOM ACCESS MEMORY CELL

[75] Inventor: Ming-Tzong Yang, Hsin Chu, Taiwan

[73] Assignee: United Microelectronics Corporation, Hsinchu, Taiwan

[21] Appl. No.: 355,656

[22] Filed: Dec. 14, 1994

[51] Int. Cl.$^6$ .......................................... H01L 21/8244
[52] U.S. Cl. .......................................... 437/52; 437/46; 437/48; 437/56; 437/89; 437/915
[58] Field of Search ................. 437/21, 48, 52, 56, 437/89, 46, 915; 257/67, 903

[56] References Cited

U.S. PATENT DOCUMENTS

| | | | |
|---|---|---|---|
| 4,876,215 | 10/1989 | Hsu | 437/52 |
| 4,987,092 | 1/1991 | Kobayashi | 437/915 |
| 5,198,683 | 3/1993 | Sivan | 257/67 |
| 5,266,507 | 11/1993 | Wu | 437/915 |
| 5,298,782 | 3/1994 | Sundaresan | 437/915 |
| 5,354,704 | 11/1994 | Yang et al. | 437/52 |

*Primary Examiner*—Tom Thomas
*Attorney, Agent, or Firm*—George O. Saile; William Stoffel

[57] ABSTRACT

A memory cell layout and method of forming a 6 transistor SRAM memory cell that achieves a reduced cell area using uncomplicated fabrication steps. In one embodiment, a six transistor (6/T) SRAM cell has two horizontal thin-film transistor (T5, T6) as load transistors, two transfer transistors (T1, T2), two latch transistors (T3, T4) and two current nodes (38, 40). In this structure all six transistors are formed in the substrate and a single polysilicon layer.

24 Claims, 6 Drawing Sheets

METHOD OF MAKING SINGLE LAYER THIN FILM TRANSISTOR STATIC RANDOM ACCESS MEMORY CELL

BACKGROUND OF INVENTION

1) Field of the Invention

This invention relates to integrated circuits in general, and more particularly, to integrated circuit memory devices and memory device layouts.

2) Description of the Prior Art

Integrated circuit (IC) memory devices are made up of a plurality of memory cells. In general, one basic memory cell design is duplicated numerous times to form the plurality of cells. The basic cell design may be modified slightly from cell to cell, for example one cell may be a reversed image or complement of an adjacent cell, but the entire memory device can be described according to the basic cell design.

In the case of static random access memory (SRAM) devices, the basic cell is usually in one of two forms, either a six transistor (6T) cell or four transistor/two resistor (4T/2R) cell. Many conventional SRAMs using a 6T configuration have six transistors formed in a bulk semiconductor substrate such as single crystal silicon. This type of SRAM is often fabricated in complementary metal oxide semiconductor (CMOS) technology, four of the transistor being n-channel devices while the remaining two transistors are p-channel devices. The 6T configuration offers several advantages, one being that the device operates at a low level of power. Another advantage is that bulk transistors have good electrical characteristics, including high mobility and low threshold voltages. Moreover, 6T SRAMs are considered to be very stable, having high immunity to cell upsets, such as soft error caused by incident alpha particles. Unfortunately, 6T SRAM cells utilizing transistors formed in a bulk substrate consume a large area because the transistors are formed next to one another in the substrate and are essentially in the same plane. This use of six bulk transistors imposes an unnecessary lower limit on the cell size. Achieving the smallest cell size with the simplest process can reduce the manufacturing costs, increase memory capacity, and increase the device performance without increasing the overall device size.

A reduction in cell area in comparison to the build 6T cell area can be achieved by using a 4T/2R configuration. Cell area is able to be reduced because only four transistors are formed next to one another in a bulk substrate. The four bulk transistors are most often n-channel devices, but may also be p-channel devices enabling the SRAM to be fabricated in either NMOS or PMOS technology. Two resistors that function as load elements are formed above the four bulk transistors, thereby requiting at least one additional conductive layer. A disadvantage with implementing a 4T/2R cell design is that fabrication complexity is increased in comparison to a bulk 6T SRAM design as a result of the additional conductive layer. The additional conductive layer requires at least two more masking steps and also creates a more severe surface topography on the device. As the topography becomes rougher, it becomes more difficult to contact metallization layers, such as bit line metal, to areas within the cell.

Besides an increase in fabrication complexity, 4T/2R SRAM configurations have another disadvantage compared to 6T SRAM configurations. The two load resistors in a 4T/2R SRAM are passive elements whereas the two load transistors in a 6T SRAM are active elements. The 4T/2R SRAM load resistors are passive because the amount of current the resistors can supply to a transistor within the cell is fixed, regardless of the amount to current necessary to store and retain information in a node of the cell. Unfortunately, if the current supplied by a resistor is less than the needed to maintain a logic state, the cell becomes unstable and susceptible to information loss. Load transistors, on the other hand, are able to vary the amount to current being supplied to a node to meet demand, and therefore will be more able to maintain the node's logic state absent any defects in the cell. Yet another disadvantage with the 4T/2R SRAM design is that the 4T/2R SRAM cell requires a relatively high level of power because resistors continuously draw current rather than drawing current only as needed.

A compromise between the advantages and disadvantages of that bulk 6T cell and the 4T/2R cell is the use of a 6 transistor thin-film transistor (6T/TFT) load SRAM cell. As the name suggests, this type of cell utilizes thin-film transistors (TFTs) as load transistors. TFTs, sometimes referred to as polysilicon transistors, are transistors in which both current electrodes and control electrode (i.e., the source, drain, and gate) are each made of a material other than the substrate material, for example polysilicon. The complete 6T/TFT load SRAM cell includes four bulk transistors (2 latch and 2 transfer transistors), usually n-channel devices, and two TFT load transistors which are usually p-channel devices. The two passive load resistors in a 4T/2R cell are replaced in a 6T/TFT load cell by the two TFT load transistors. Thus, the 6T/TFT load SRAM has all the advantages of having active load elements.

Figure 1:
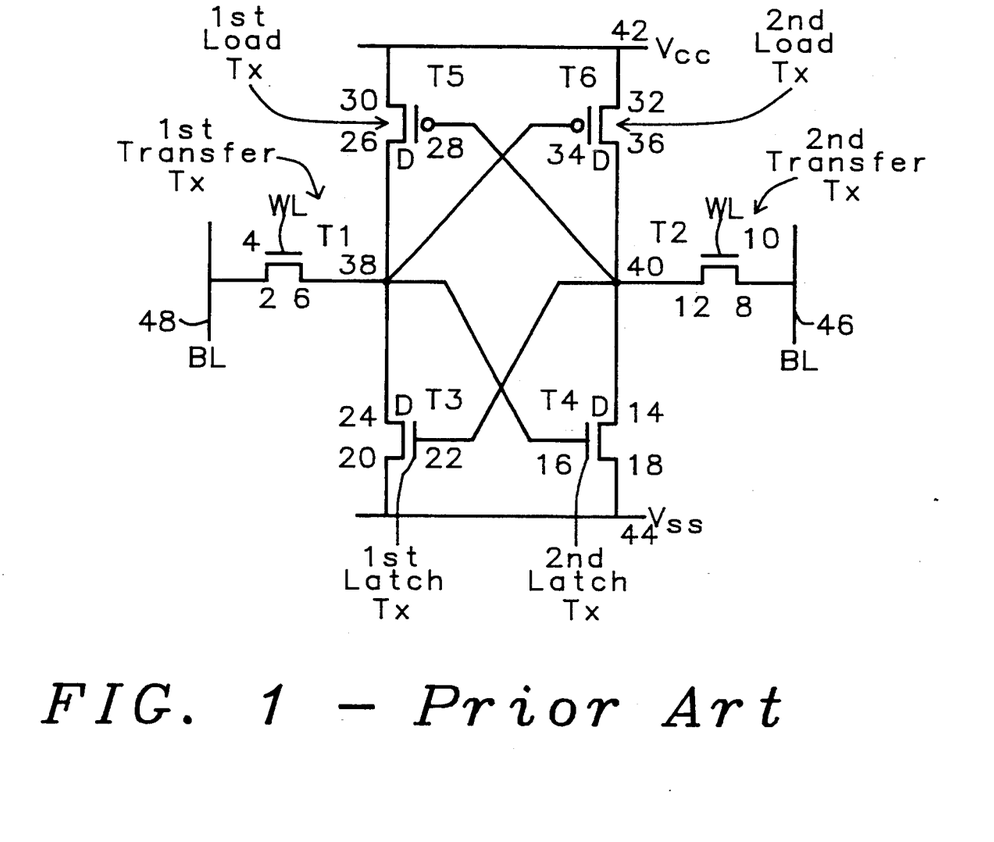
FIG. 1 is an electrical schematic of a conventional 6T SRAM cell.

FIG. 1 shows an electrical schematic of a 6 transistor static random access memory device (6T SRAM). Transistors labeled T1 and T2 are transfer transistors, T3 and T4 are latch transistors, and T5 and T6 are load transistors. A current electrode 30, 32 of the load transistors is connected to a bit line 46, 48.

Although thin film transistors (TFTs) typically do not have electrical characteristics as good as those of bulk transistors, the savings from cheaper fabrication costs are considered by many to outweigh electrical disadvantages. The size of a 6T/TFT load SRAM cell is comparable to that of a 4T/2R cell, yet the use of two load transistors results in a much more stable device than a cell which employs resistors. Power consumption of a 6T/TFT load SRAM is higher than that of the bulk 6T device, but considerable lower than that of the 4T/2R device.

Overall, the 6T/TFT load SRAM is considered to have better electrical performance than a 4T/2R SRAM while maintaining a favorable sized cell. However, there is a need to reduce cell size further to achieve increased memory capacity without an increase in device size. Therefore, a need exists for an improved integrated circuit memory device, and more specifically for an improved integrated circuit memory device and a structural layout thereof in which cell size is reduced over existing memory cells.

Silvan, U.S. Pat. No. 5,198,683 discloses a 6T/TFT SRAM cell which contains two vertical load thin film transistors (TFTs). Vertical TFTs are similar to standard TFTs in that both the source, drain, and gate are composed of a material other than the substrate, sometimes polysilicon. In a vertical TFTs, the transistor is formed in a trench in the substrate. Four of five interconnects associated with each storage node are defined by trenches. The use of vertical TFTs and consolidation of the contacts in the trench allows for a substantial reduction in cell size. The reduction is attributable to the small size of vertical TFT as compared to more common planar transistors. Also, the transistor interconnects are confined to a small area within the cell which is defined by a minimum feature size. However, the manufacturing process for vertical TFTs is complicated and expensive because vertical TFT are formed from four layers of polysilicon and trench construction is complex.

SUMMARY OF INVENTION

It is an object of the invention to provide an improved structure and method for a computer memory device.

A more specific object of the present invention is to provide an improved structure and method for forming a six transistor/thin film transistor static random access memory device.

An more specific object of the present invention is to provide an improved structure and method for forming a six transistor/thin film transistor static random access memory device which has a reduced cell area and a simpler construction.

In accordance with the above objects, a structure and process for fabricating a 6T/TFT SRAM are provided. One embodiment of the present invention is an improved configuration for a 6T/TFT SRAM device. The invention utilizes only one polysilicon layer by forming pMOS load transistors upside down, (i.e. with the gate electrodes in a buried N+ region while the channel, source, and drain are formed in the polysilicon layer). The present invention forms the 6T SRAM electrical circuit shown in FIG. 1 implemented in the structure shown in FIG. 2a. (top plan view). The device consists of first and second transfer transistors; first and second latch transistors; and first and second load transistors. Each transistor having first and second current electrodes (source and drains) and a control electrode (gate). The transfer transistors (T1, T2) and latch transistors (T3, T4) are formed with the source and drains comprising buffed conductive regions in the substrate and the gate is formed in the polysilicon line pattern. The load transistors are preferably pMOS TFT transistors formed with the source and drains as P-regions in the polysilicon line pattern and the gates as N regions in the substrate as shown in FIGS. 2A through 7.

In the method of the present invention for forming the 6T TFT SRAM, a base oxide layer and field oxide regions are formed on a substrate. N+ Buffed impurity regions are formed in the substrate thereby forming control electrodes of the load transistors. Next, the base oxide layer is removed and a gate oxide layer is formed on the substrate surface. Buried contact openings in the gate oxide are formed which define first and second current nodes. A layer of polycrystalline silicon is deposited on the substrate surface and the polysilicon layer is blanked implanted with N type ions. Next, first and second electrodes of the first and second load transistors are formed by ion implantation into the polysilicon layer. Subsequently, the polycrystalline silicon layer is patterned to form a polycrystalline silicon line pattern on the substrate surface.

Afterwards, control gates of latch transistors and of the transfer transistors; electrodes of the transfer transistors and the latch transistors; and the interconnects between the control gates of the load transistor and the current nodes are formed by selectively ion implanting the polysilicon line pattern and the substrate, thereby forming the 6 Transistor thin film transistor SRAM device of the present invention.

The foregoing and other objects, features, aspects and advantages of the present invention will become more apparent from the following detailed description of the present invention when taken in conjunction with the accompanying drawings.

BRIEF DESCRIPTION OF THE DRAWINGS

The drawings show the following:

FIGS. 4 through 7 are sequence of cross-sectional views in broken section in greatly enlarged scale that illustrate a process for forming buried conductive lines in accordance with the process of the invention.

DETAILED DESCRIPTION OF THE PREFERRED EMBODIMENTS

The present invention provides a substantial reduction in the number of conductive layers of a memory device without increasing the cell area in a memory device. As an example, a 6T/TFT load SRAM cell and layout in accordance with the present invention reduces the number of polysilicon/polycide layers from 4 layers to 1 layer. Also, the invention achieves a 40 to 70% reduction in cell area over conventional 6T/non-TFT load cells, such as those implemented in 0.5 um CMOS technology. The size and layer reduction of the invention is attributable to the utilization of pMOS load transistors formed upside-down, that is, with the gate electrodes in a buried N+ layer in the substrate while the channel, source, and drains are formed in the polysilicon layer. By forming all three types of transistors, the load, latch, and transfer transistors, in the substrate and the first polysilicon layer, cell size is reduced and only one conductive layer is utilized. This reduces the manufacturing costs, and reduces cell size while increasing the memory cell performance.

The present inventions will be described in detail with reference to the accompanying drawings. It should be noted that the drawings are in greatly simplified form. In practice the memory device structure will be one of many supported on a common substrate connected with suitable metallurgy in various electronic circuit configurations. Also, the term "control electrode" refers to a "gate" electrode in an transistor and "current electrodes" refers to either source or drain elements in a transistor.

The invention will be explained with reference to the electrical schematic of a 6T/SRAM shown in FIG. 1.

The transistors elements are defined as follows:

First and second transfer transistors (T1 and T2), each has a control electrode (4, 10) and first and second current electrodes (2, 6 and 8, 12).

First and second load transistors (T5 and T6), each has a control electrode (28 and 34) and first and second current electrodes (26, 30 and 32, 36).

First and second latch transistors (T3 and T4) each has a control electrode (16 and 22) and first and second current electrodes (14, 18 and 20, 24).

Figure 2A:
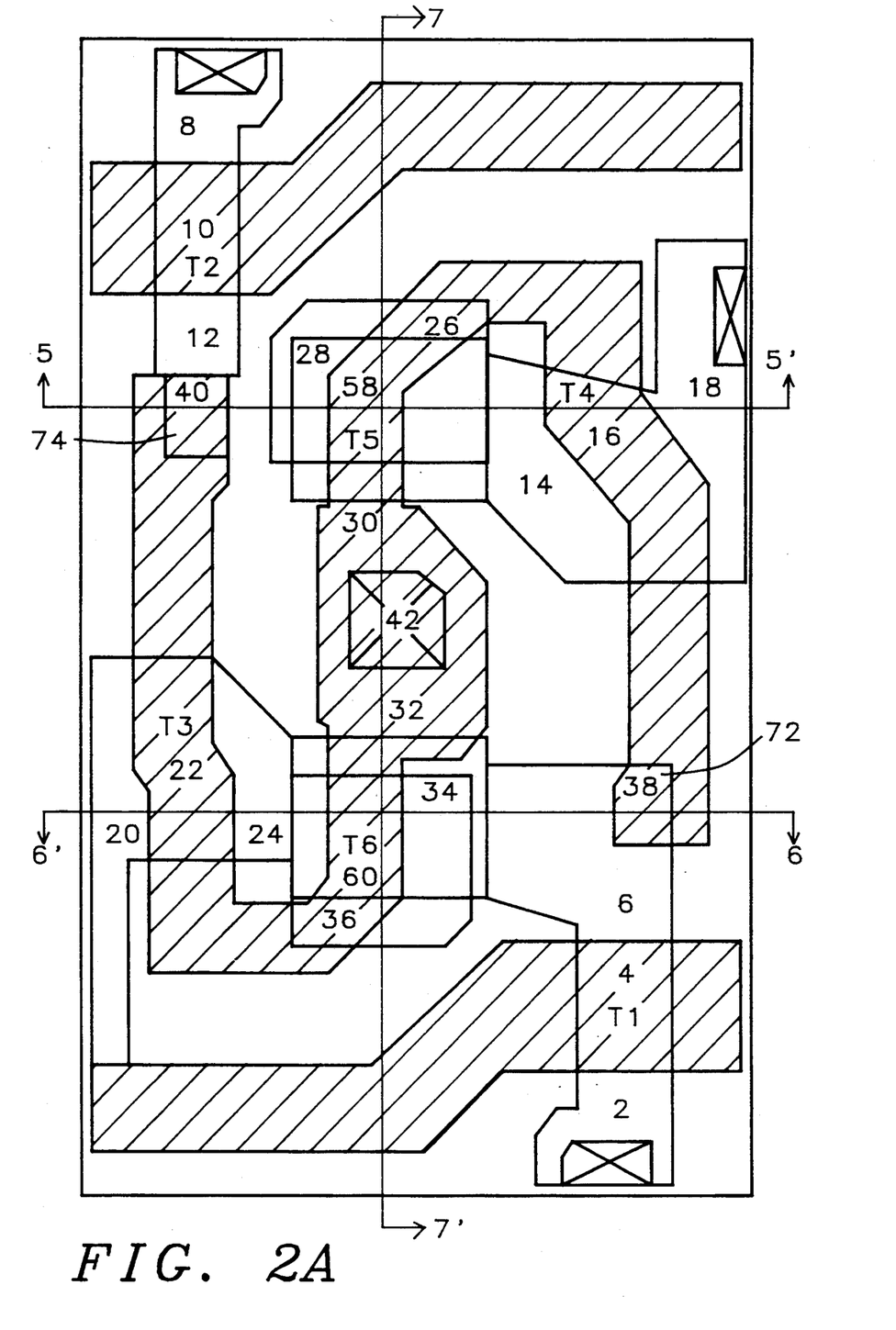
FIG. 2A is a top plan view of the memory device of the present invention.
Figure 3:
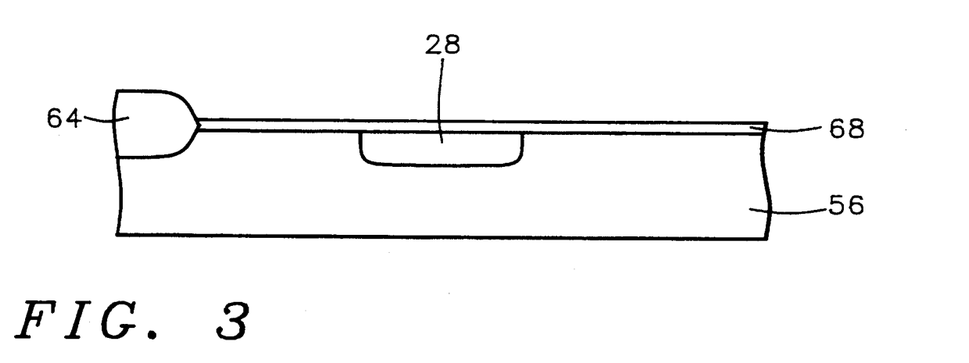
FIGS. 3 through 5 are cross-sectional views taken along axis 5 in FIG. 2A.
Figure 4:
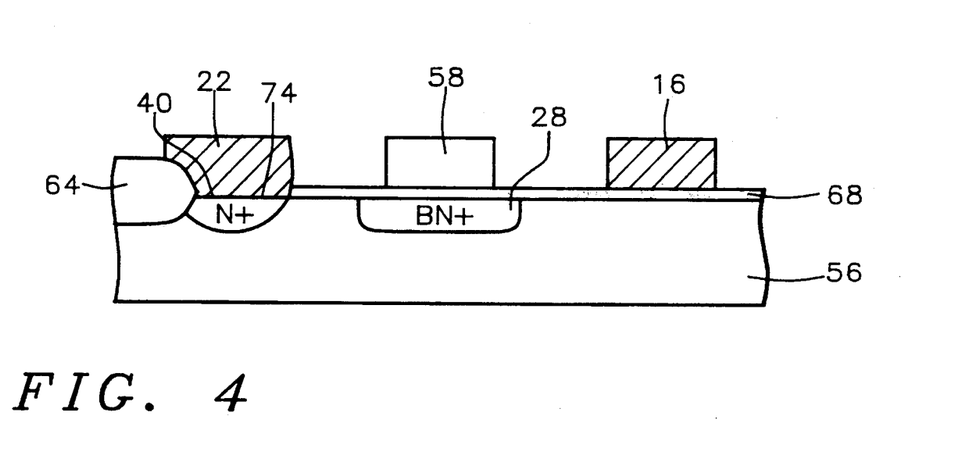
Figure 5:
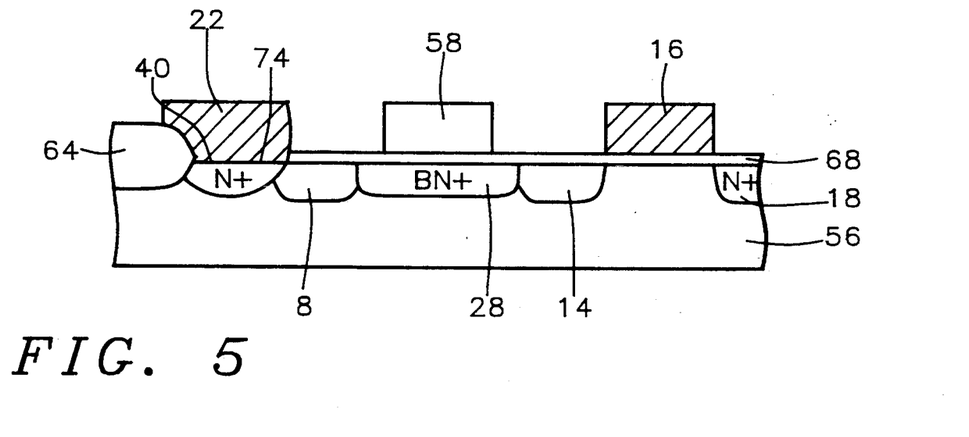
Figure 6:
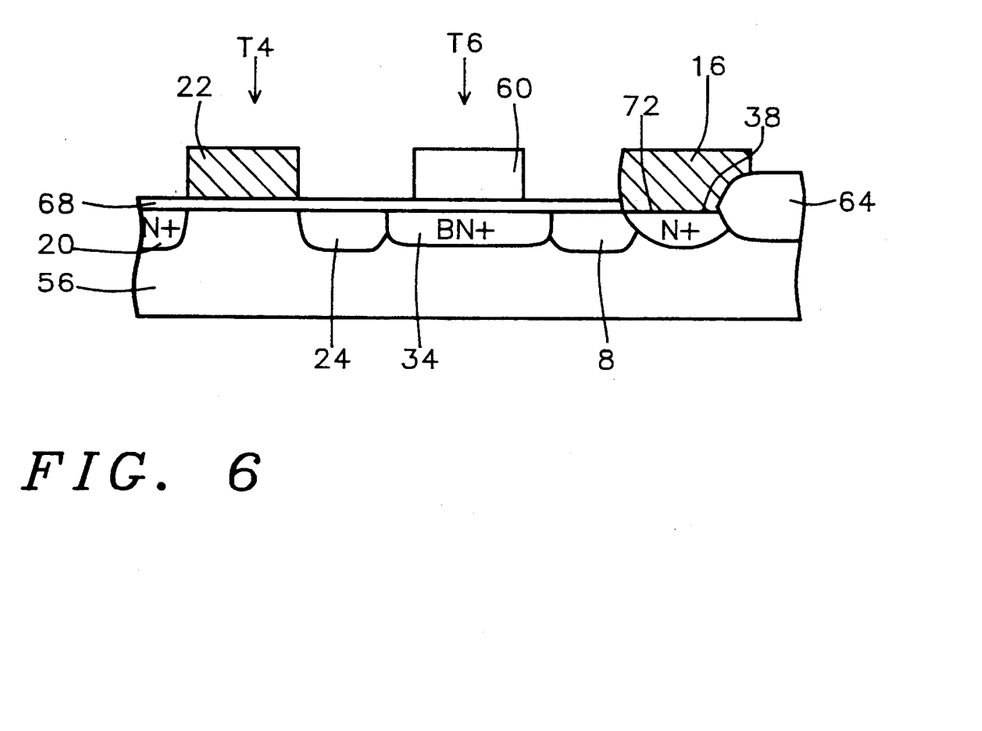
FIG. 6 is a cross-sectional view taken along axis 6 in FIG. 2A
Figure 7:
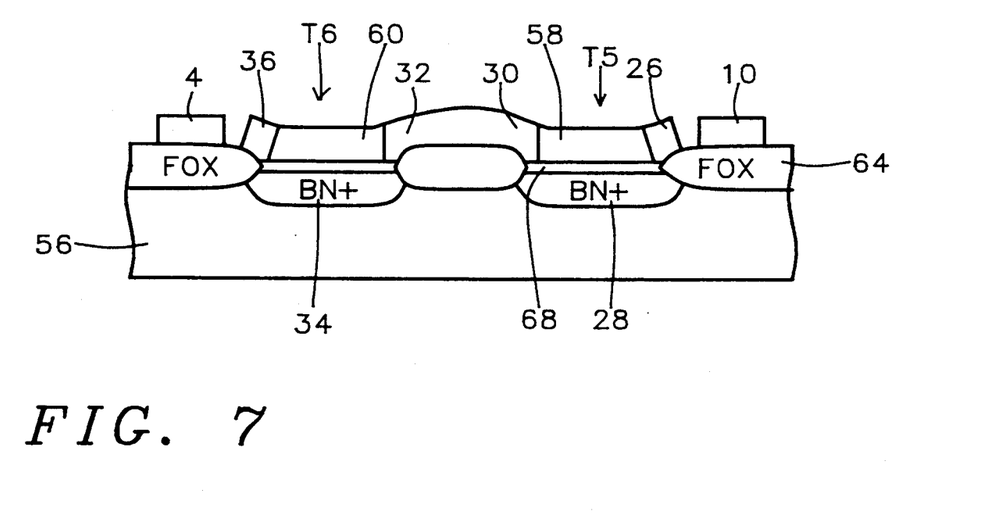
FIG. 7 is a cross-sectional view taken along axis 7 in FIG. 2A.

FIG. 2A shows a top plan view of the completed 6T/TFT SRAM of the present invention. FIGS. 3 through 5 are cross-sectional views taken along axis 5 in FIG. 2A FIG. 6 is also a cross-sectional view taken along axis 6 in FIG. 2A. FIG. 7 is a cross-sectional view taken along axis 7 in FIG. 2A.

The following elements are illustrated and numbered in FIGS.:

2—1st electrode of 1st transfer transistor
4—control electrode of 1st transfer transistor
6—2nd electrode of 1st transfer transistor
8—1st electrode of 2d transfer transistor
10—control electrode of 2d transfer transistor
12—2nd electrode of 2d transfer transistor
14—first electrode of 2nd latch transistor
16—control electrode of 2nd latch transistor
18—second electrode of 2nd latch transistor
20—second electrode of 1st latch transistor
22—control electrode of 1st latch transistor
24—first electrode of 1st latch transistor
26—first electrode of 1st load transistor
28—control electrode of 1st load transistor
30—second electrode of 1st load transistor
32—second electrode of second load transistor
34—control electrode of second load transistor
36—first electrode of second load transistor
38—current node 1
40—current node 2
42—Vcc contact line
44—Vss contact line
46—first bitline
48—second bitline Illustrated in FIG. 1 is a circuit diagram for a conventional 6T SRAM cell. The operation of the cell which is conventional and is not relevant for the present invention, will therefore not be described. The SRAM cell is comprised of six transistors: two transfer transistors T1, T2, two latch transistors T3, T4, and two load transistors T5, T6. The six transistors are electrically coupled to form two data storage nodes 38, 40, as Node 1 and Node 2. Node 1 electrically couples a drain 24 of latch transistor T3, a gate 16 of latch transistor T4, gate 34 of load transistor T6, the drain 26 of load transistor T5 and one of two current electrodes 6 of transfer transistor T1, either the source or the drain depending on whether a "high" or "low" data state has been stored in the cell. Node 2 is a complement of Node 1 and electrically couples a drain 14 of latch transistor T4, a gate 16 of latch transistor T3, a gate 28 of load transistor T5, a drain 36 of load transistor T6 and one of the two current electrodes 12 (either the source or drain) of transfer transistor T2. A source electrode 30, 32 of each load transistor T5, T6, is coupled to power supply labeled $V_{cc}$, while a source electrode 18, 20 of each of the latch transistors T3 T4 is coupled to a power supply labeled $V_{ss}$. Bit lines 46 and 48, labeled B/L in FIG. 1, are coupled to a current electrodes 2, 8 of transfer transistors T1 and T2 respectively.

The conventional SRAM schematic illustrated in FIG. 1 may be implemented using a structural layout and memory cell in accordance with the present invention. The terms latch transistor, transfer transistor, load transistor, data storage node, and others which were used to describe the SRAM cell discussed above will also be used throughout that description of the present invention.

Figure 2B:
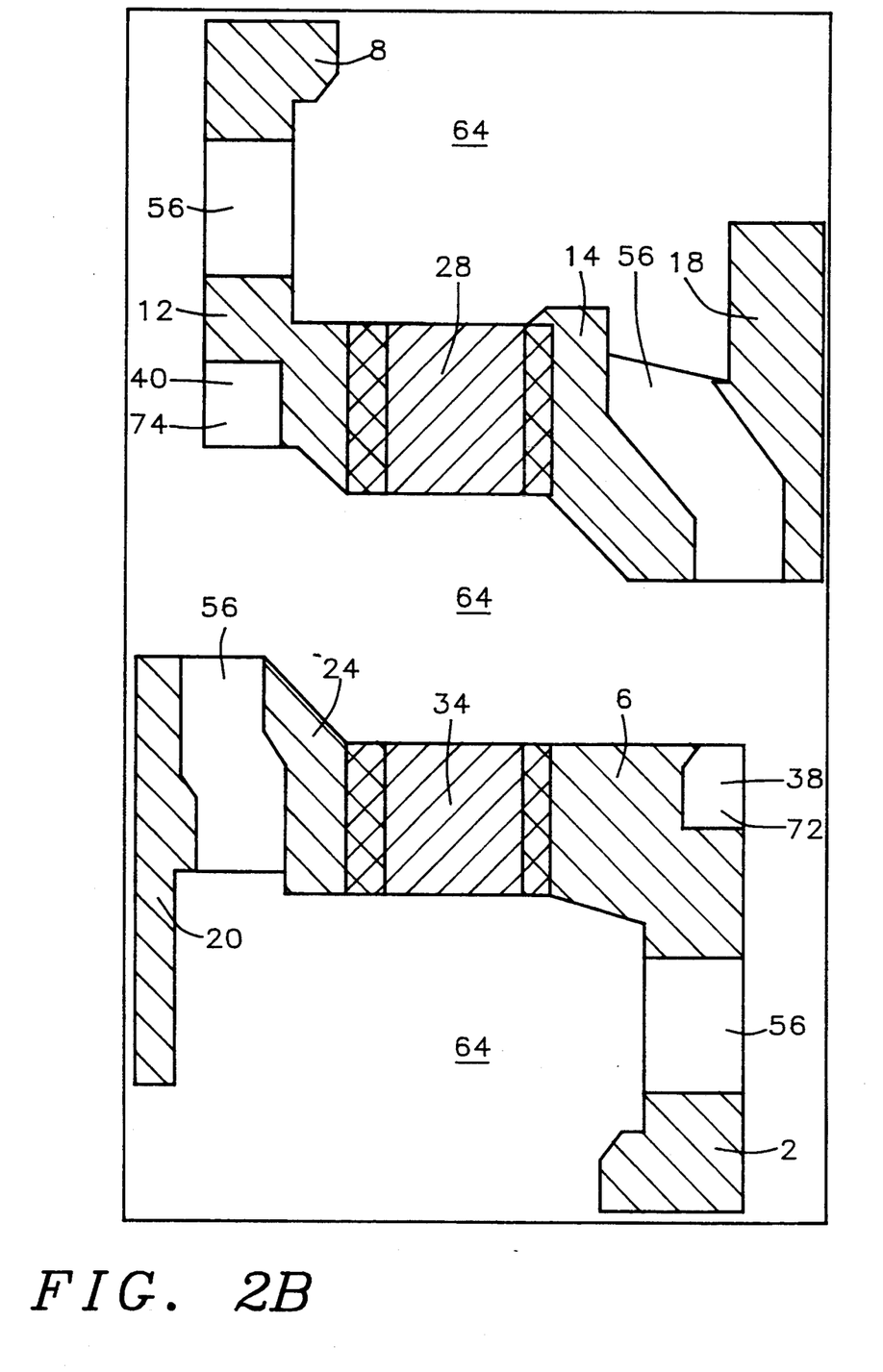
FIGS. 2B and 2C are top plan views of the device of the present invention showing various device layers.
Figure 2C:
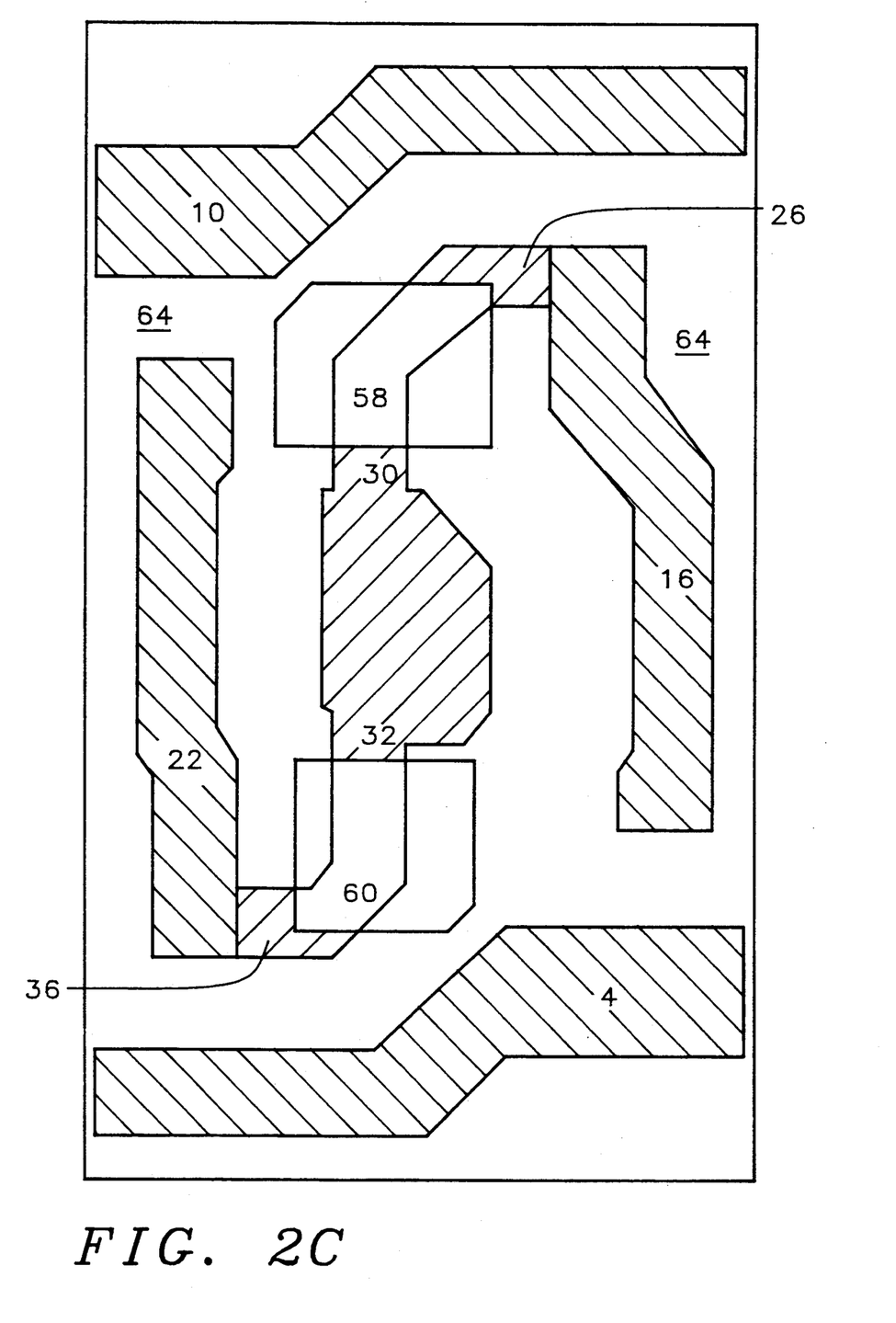

FIGS. 2A, 2B, and 2C, illustrate a structural layout of a memory device cell which utilizes two horizontal TFT load transistors in accordance with the device of the present invention. These illustrations show pMOS load transistors and nMOS transfer and latch transistors, but opposite conductivity type transistors may also be fabricated. One skilled in the art is able to fully comprehend the present invention by reviewing the layout illustrated in FIG. 2A along with the corresponding cross-sectional illustrations of the cell shown in FIGS. 3 through 7. FIGS. 2B and 2C, illustrate top plan views of specific device layers of the present invention.

In addition to the numbers defined above, the following numbers are shown in FIGS. 2A through 7:

30, 32—current electrodes of load transistors T5, T6
56—semiconductor substrate
58—channel for 1st load transistor T5
60—channel for 2nd load transistor T6
64—field oxide
68—gate oxide The substrate 56 shall be a monocrystalline silicon semiconductor body with many devices fabricated therein, as is well known in the art. The background substrate dopant is preferably p-type, with a concentration in the range of 1E15 to 1E18 cm$^{-3}$.

First, a base oxide layer is formed on substrate 56 (not shown in the FIGS.). Base oxide has a thickness in the range of 50 to 500 angstroms.

As shown in FIG. 3, field oxide regions 64 are formed on the substrate 56 using conventional masking and oxidation techniques. Field oxide regions 64 have a thickness in the range of 1000 to 10,000 angstroms. Field oxide regions 64 are also shown in FIG. 2A.

A first photoresist masking layer (not shown) is formed with openings that define the control gates 28, 34 of the load transistors T5, T6.

Impurity ions of a second conductivity type are implanted though the opening in the first masking layer to form control gate electrodes 28, (and 34) as shown in FIG. 2A, 2B and 3. The control gate implantation injects arsenic or phosphorous ($P_{31}$) ions and has a dosage in the range of 5E13 to 1E16 atoms/cm$^2$ and an acceleration energy of 10 to 150 Kev. Control gate electrodes 28, 34 have an impurity concentration in the range of 1E18 to 1E22 atoms/cm$^3$. The first masking layer and the base oxide layer are then removed.

A gate oxide 68 is then grown on the substrate surface which will act as the gate oxide for the load transistors (T5 T6) as shown in FIG. 3.

Using conventional photolithography and etching techniques, openings are formed in the gate oxide 68 layer which define the buried contact openings 72, 74 shown in FIGS. 2A, 4, 5, and 6.

Next, a layer of polycrystalline silicon is deposited on the substrate surface. The polysilicon layer has a thickness in the range of 1000 to 6000 angstroms. The polysilicon layer can be deposited by prolyzing silane using a low pressure chemical vapor deposition process at temperature between 500° to 750° C.

Next, a TFT channel blanket implant is performed where the polysilicon line pattern 22, 36, 30, 32, 24, 16, is implanted with impurity ions of a first conductivity type thereby doping the polysilicon line pattern to a concentration in the range of 1E16 to 5E18 atoms/cm3. The ions implanted can be boron or $BF_2$. For Boron ions, the implantation can be performed with an energy of 10 to 100 Kev and a dosage in the range of 1E12 to 1E14 atoms/$cm^2$. For $BF_2$ ions, the implantation can be performed with an energy of 20 to 150 Kev and a dosage in the range of 1E12 to 1E14 atoms/$cm^2$. This implant dopes the gates (TFT channels) 60 and 62 of the load transistors T5, T6.

A TFT source/drain masking layer is formed on the substrate surface having second openings which define the first and second electrodes of the first and second load transistors 26, 30, 32, 36. Next, impurity ions of a second impurity type are implanted through the second openings in the second mask, forming the first and second electrodes of the first and second load transistors 26, 30, 32, 36 shown in FIG. 2A and 2C.

The polysilicon layer is patterned with a poly line pattern masking layer and etched using a conventional photolithographic process forming a polycrystalline line pattern that will define control gate of transfer transistor T3, first electrode of the second load transistor 36, second electrode of the first and second load transistors 30, 32 first electrode of the first load transistor 26, and control electrodes of the 2nd transfer transistor 16. The polysilicon line pattern (labeled 22, 36, 30, 32, 26, and 16) is illustrated in FIGS. 2A, and 2C.

The poly line pattern masking layer is removed and a N+ polysilicon gate/source/drain implant masking layer is formed having opening which define areas of the poly silicon line pattern which will receive a N+ ion implantation. These areas are shown on FIG. 2C as areas 10, 4, 16, and 22, the control gates 10 4 of the first and second transfer transistors T1, T2 and the control gates 22, 16 of the first and second latch transistors T3, T4. The N+ polysilicon gate/source/drain implant masking layer also has openings which define the source and drain elements of the transfer transistors 2, 6, 8, 12, T1, T2 and of the latch transistors 22, 24, 14, 18, T3, T4.

Impurity ions of a second impurity type are implanted through the openings in the poly line pattern masking layer into the polysilicon pattern forming N+ regions 10, 4, 16, and 22 shown on FIG. 2C, the control gates 10 4 of the first and second transfer transistors T1, T2 and the control gates 22, 16 of the first and second latch transistors T3, T4. The impurity ions are also implanted into the substrate forming the source and drain elements of the transfer transistors 2, 6, 8, 12, T1, T2 and of the latch transistors 22, 24, 14, 18, T3, T4. as shown in FIG. 2B. The ions implanted can be arsenic, or $P_{31}$ and can be accelerated at an energy of between 20 to 100 Kev. The implant dosage is in the range of 1E18 to 1E22 atoms/$cm^3$. The implanted regions have an impurity concentration in the range of 1E18 to 1E22 atoms/$cm^3$. The impurity ions in the polysilicon line pattern diffuse into the substrate where the polysilicon contacts the substrate in the buried contact openings thus forming the first and second current nodes 38, 40.

The N+ polysilicon gate and source/drain implant masking layer is then removed thereby forming the 6TFFFT SRAM device of the present invention. Additional passivation and conductive layers are added to electrically connect the individual SRAM devices together to form an array.

The cell of the invention is electrically identically to the electrical schematic shown in FIG. 1. Node 1, 38 is defined where the control gate 16 of the second latch transistor T4 (formed in the polysilicon line pattern) is electrically connected to a current electrode 6 of the first transfer transistor T1 (formed in the substrate) through the contact opening 72. Also, a first buried impurity strip electrically connects the following elements: the drain 26 of the first latch transistor T3, the control gate of second load transistor T6, and the first electrode 6 of said first transfer transistor T1. Furthermore, a first polysilicon strip includes the following elements electrically connected: drain 26 of the first load transistor (T5), the gate 16 of the second latch transistor (T4), and node 1.

Node 1 has five connections (also shown in FIG. 1) which are as follows: 1) a connection to the first current electrode 6 of first transfer transistor (T1), by the definition of node 1, node 1 is electrically connected to the first current electrode 6 of first transfer transistor (T1); 2) a connection to the drain 24 of the first latch transistor (T3), the connection formed by the second buffed impurity strip; 3) a connection to the gate 16 of the second latch transistor (T4); the connection is formed by the first polysilicon strip which includes said control electrode of second latch transistor (T4); 4) a connection to the gate 34 of second load transistor (T6), the connection which is formed of second buried impurity strip (gate 34 to current electrode 6 of T1 to node 1); 5) a connection to the drain 26 of the first load transistor (T5), the connection is formed by the first polysilicon strip which includes said control electrode of second latch transistor (T4) (drain 26 to gate 16 of T4 to node 1).

Similarly, Node 2 (40) is defined where the control gate 22 of the first latch transistor T3 (formed in the polysilicon line pattern) is electrically connected to a current electrode 12 of the second transfer transistor T2 (formed in the substrate) through the contact opening 74. Also, a second buffed impurity strip electrically connects the following elements: the drain 14 of the second latch transistor T4, the control gate electrode 28 of first load transistor T6, and the first electrode 12 of the second transfer transistor T1. Furthermore, a second polysilicon strip includes the following elements electrically connected: drain 36 of the second load transistor (T6), the gate electrode 22 of the first latch transistor (T3), and node 2.

Node 2 has five connections (also shown in FIG. 1) which are as follows: 1) a connection to the first current electrode 12 of the second transfer transistor (T2), the connection formed by the second buried impurity strip. (by the definition of node 2, node 2 is electrically connected to the first current electrode 12 of the second transfer transistor(T2); 2) a connection to the drain 14 of the second latch transistor (T4), the connection formed by the second buffed impurity strip (drain 14 to gate electrode 28 of the first load transistor T5 to first current electrode of T2 to node 2); 3) a connection to the gate electrode 22 of first latch transistor (T3), the connection comprised of the second polysilicon strip (gate electrode 22 to Node 2); 4) a connection to the control electrode 28 of first load transistor (T5) comprised of second buffed impurity strip, (28 to the first current electrode 8 to Node 2); 5) a connection to the first current electrode 36 of second load transistor (T6) comprised the second polysilicon strip which includes said control electrode of first latch transistor (T3) (36 to gate 22 of T3 to node 2).

While the invention has been particularly shown and described with reference to the preferred embodiments thereof, it will be understood by those skilled in the art that various changes in form and details may be made without departing from the spirit and scope of the invention.

What is claimed is:

1. A method of forming a six transistor static random access memory cell having first and second latch transistors, each latch transistor having a control electrode and first and second current electrodes; first and second transfer transistors, each transfer transistor having a control electrode and first and second current electrodes; first and second load transistors, each load transistor having a control electrode and first and second current electrodes; the memory cell formed on a monocrystalline semiconductor substrate having a background impurity of a first conductivity type with overlaying gate oxide layer and a single surface single polysilicon layer, comprising the steps of:

forming a base oxide on the substrate surface;

forming field oxide regions in the surface of the substrate;

forming a first masking layer over said base oxide that defines first openings for buried N+ regions which function as the control electrodes of the load transistors;

forming buried impurity regions of a second conductivity type in the substrate through said first openings defined by said first mask thereby forming control electrodes of the load transistors;

removing the first masking layer and the base oxide layer;

forming a gate oxide on the substrate surface;

forming buried contact openings in the gate oxide which define first and second current nodes;

forming a layer of polycrystalline silicon on the substrate surface;

blanket implanting impurity ion of a first conductivity type into the polycrystalline silicon layer;

forming a second mask on the substrate having second openings which define first and second electrodes of the first and second load transistors;

introducing impurity ions of a first conductivity type into the polycrystalline silicon layer through the second openings in the second mask to form first and second electrodes of the first and second load transistors;

removing the second masking layer;

etching the polycrystalline silicon layer to form a polycrystalline silicon line pattern on the substrate surface;

forming a third masking layer on the substrate having openings which define the control electrodes of the latch transistors and control electrodes of the transfer transistors; and which define the current electrodes of the transfer transistors and current electrodes of the latch transistors and interconnects between the control electrodes of said first and second load transistor and said first and second current nodes;

introducing impurity ions of a second conductivity type into the polysilicon line pattern and substrate through the openings in the third masking layer to form control electrodes of the latch transistors and control electrodes of the transfer transistors and current electrodes of the transfer transistors and current electrodes of the latch transistors and the interconnects between the control electrodes of said first and second load transistor and said first and second current nodes; and removing the third masking layer and thereby forming a six transistor SRAM device.

2. The method of claim 1 wherein the semiconductor substrate has a P-type background impurity with a p-type impurity concentration in the range of 1E15 to 1E18 atoms/cm$^3$.

3. The method of claim 1 wherein the base oxide has a thickness in the range of 50 to 500 Å.

4. The method of claim 1 wherein the impurity ions of a first conductivity type are ion selected from the group consisting of boron and boron fluoride (BF$_2$).

5. The method of claim 1 wherein the impurity ions of a second conductivity type are ion selected from the group consisting of arsenic and phosphorus.

6. The method of claim 1 wherein the polycrystalline silicon layer has a thickness in the range of 1000 to 6000 Å.

7. The method of claim 1 wherein the control electrodes of the load transistors are formed by ion implanting an ion selected from the group consisting of arsenic and phosphorous (P$_{31}$) ions; with a implant dosage in the range of 5E13 to 1E16 atoms/cm$^2$; and an acceleration energy of 10 to 150 Kev.

8. The method of claim 1 wherein the control electrodes of the load transistors have an impurity concentration in the range of 1E18 to 1E22 atoms/cm$^3$.

9. The method of claim 1 wherein the blanket implant of impurity ions of the first impurity type into the polycrystalline silicon layer is performed with boron ions with an implant energy of 10 to 100 Kev and a dosage in the range of 1E12 to 1E14 atoms/cm$^2$.

10. The method of claim 1 wherein the blanket implant of impurity ions of the first impurity type into the polycrystalline silicon layer is performed with BF$_2$ ions with an energy in the range of 20 to 150 Kev and a dosage in the range of 1E12 to 1E14 atoms/cm$^2$.

11. The method of claim 1 wherein the blanket implant of impurity ions of the first impurity type into the polycrystalline silicon layer dopes the layer to a concentration in the range of 1E16 to 5E18 atoms/cm$^3$.

12. The method of claim 1 wherein the control gates of the first and second latch transistors and of the first and second transfer transistors and first and second electrodes of the transfer transistors and the latch transistors and the interconnects between the control gates of said first and second load transistor and said first and second current nodes are formed by ion implanting and ion selected from the group consisting of arsenic and P$_{31}$ with an implant energy of between 20 to 100 Kev and an implant dosage is in the range of 1E18 to 1E22 atoms/cm$^3$.

13. A method of forming a six transistor static random access memory cell having first and second latch transistors; each latch transistor having a control electrode and first and second current electrodes; first and second transfer transistors, each transfer transistor having a control electrode and first and second current electrodes; first and second load transistors, each load transistor having a control electrode and first and second current electrodes; the memory cell formed on a monocrystalline semiconductor substrate having a background impurity of a first conductivity type with overlaying gate oxide layer and a single surface polycrystalline silicon layer, comprising the steps of:

forming a base oxide on the substrate surface;

forming field oxide regions in the surface of the substrate;

forming buried impurity regions of a second conductivity type in the substrate thereby forming control electrodes of the load transistors;

removing the base oxide layer;

forming a gate oxide layer on the substrate surface;

forming buried contact openings in the gate oxide layer which define first and second current nodes;

forming a layer of polycrystalline silicon on the substrate surface;

blanket implanting impurity ions of a first conductivity type into the polycrystalline silicon layer;

introducing impurity ions of a first conductivity type into the polysilicon line pattern to form first and second current electrodes of the first and second load transistors;

etching the polycrystalline silicon layer to form a polycrystalline silicon line pattern on the substrate surface; and introducing impurity ions of a second conductivity type into the polysilicon line pattern and substrate through openings in a third mask to form the control electrodes of the first and second latch transistors and of the first and second transfer transistors and first and second electrodes of the transfer transistors and the latch transistors and interconnects between the control gates of said first and second load transistor and said first and second current nodes and thereby forming a six transistor thin film transistor SRAM device.

14. The method of claim 13 wherein the semiconductor substrate has a P-type background impurity with a p-type impurity concentration in the range of 1E15 to 1E18 atoms/cm$^3$.

15. The method of claim 13 wherein the base oxide has a thickness in the range of 50 to 500 Å.

16. The method of claim 1 wherein the impurity ions of a first conductivity type are ion selected from the group consisting of boron and fluoride (BF$_2$).

17. The method of claim 1 wherein the impurity ions of a second conductivity type are ions selected from the group consisting of arsenic and phosphorus.

18. The method of claim 13 wherein the polycrystalline silicon layer has a thickness in the range of 1000 to 6000 Å.

19. The method of claim 13 wherein the control electrodes of the load transistors are formed by ion implanting ions selected from the group consisting of arsenic and phosphorous (P$_{31}$) ions; with a implant dosage in the range of 5E13 to 1E16 atoms/cm$^2$ and an acceleration energy of 10 to 150 Kev.

20. The method of claim 13 wherein the control electrodes of the load transistors have an impurity concentration in the range of 1E18 to 1E22 atoms/cm$^3$.

21. The method of claim 13 wherein the blanket implant of impurity ions of the first impurity type into the polycrystalline silicon layer is performed with boron ions with an implant energy of 10 to 100 Kev and a dosage in the range of 1E12 to 1E14 atoms/cm$^2$.

22. The method of claim 13 wherein the blanket implant of impurity ions of the first impurity type into the polycrystalline silicon layer is performed with BF$_2$ ions with an energy in the range of 20 to 150 Kev and a dosage in the range of 1E12 to 1E14 atoms/cm$^2$.

23. The method of claim 13 wherein the blanket implant of impurity ions of the first impurity type into the polycrystalline silicon layer dopes the polycrystalline silicon layer to a concentration in the range of 1E16 to 5E18 atoms/cm$^3$.

24. The method of claim 13 wherein the control gates of the first and second latch transistors and of the first and second transfer transistors and first and second electrodes of the transfer transistors and the latch transistors and the interconnects between the control gates of said first and second load transistor and said first and second current nodes are formed by ion implanting and ion selected from the group consisting of arsenic and P$_{31}$ with an implant energy of between 20 to 100 Kev and an implant dosage is in the range of 1E18 to 1E22 atoms/cm$^3$.

* * * * *